(12) United States Patent
Li

(10) Patent No.: US 9,196,736 B2
(45) Date of Patent: Nov. 24, 2015

(54) ARRAY SUBSTRATE AND MANUFACTURING METHOD THEREOF AND DISPLAY DEVICE

(71) Applicant: Beijing BOE Optoelectronics Technology Co., Ltd., Beijing (CN)

(72) Inventor: Wei Li, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 0 days.

(21) Appl. No.: 13/947,602

(22) Filed: Jul. 22, 2013

(65) Prior Publication Data

US 2014/0070221 A1 Mar. 13, 2014

(30) Foreign Application Priority Data

Sep. 13, 2012 (CN) .......................... 2012 1 0340180

(51) Int. Cl.
*H01L 29/786* (2006.01)
*H01L 27/12* (2006.01)
*G02F 1/1362* (2006.01)

(52) U.S. Cl.
CPC .... *H01L 29/78669* (2013.01); *G02F 1/136213* (2013.01); *G02F 1/136286* (2013.01); *H01L 27/1214* (2013.01); *H01L 29/78678* (2013.01); *G02F 2201/121* (2013.01)

(58) Field of Classification Search
CPC ................. H01L 29/788669; H01L 29/78678; H01L 27/1214

USPC .......... 257/59, 71, 72, 448; 349/61, 106, 139; 438/34
See application file for complete search history.

(56) References Cited

U.S. PATENT DOCUMENTS

| | | | |
|---|---|---|---|
| 2006/0290863 A1 | 12/2006 | HoeSup | |
| 2007/0188669 A1* | 8/2007 | Lee et al. | ........................ 349/39 |
| 2007/0285590 A1 | 12/2007 | Wu et al. | |
| 2009/0109391 A1* | 4/2009 | Ito et al. | ........................ 349/141 |
| 2009/0135125 A1 | 5/2009 | Park | |
| 2012/0050643 A1* | 3/2012 | Li et al. | ........................... 349/61 |
| 2012/0249496 A1* | 10/2012 | Pai | ................................ 345/204 |

FOREIGN PATENT DOCUMENTS

| | | |
|---|---|---|
| CN | 1885140 A | 12/2006 |
| CN | 101086567 A | 12/2007 |

(Continued)

OTHER PUBLICATIONS

First Office Action issued by the Korean Patent Office for Korean Patent Application No. 10-2013-0110378 dated Jun. 19, 2014.

(Continued)

*Primary Examiner* — Sheng Zhu

(57) ABSTRACT

Embodiments of the present invention provide an array substrate, a manufacturing method thereof and a display device. The array substrate comprises a plurality of pixel regions arranged in a two-dimensional matrix, gate lines extending along a row direction of the two-dimensional matrix and data lines extending along a column direction of the two-dimensional matrix, each pixel region including a pixel electrode. The array substrate further comprises at least one common electrode line, and the common electrode line is disposed to be parallel to the data lines.

15 Claims, 3 Drawing Sheets

(56) References Cited

FOREIGN PATENT DOCUMENTS

| KR | 20080019800 A | 3/2008 |
|----|---------------|--------|
| KR | 10-2009-0043750 A | 7/2009 |

OTHER PUBLICATIONS

English translation of First Office Action issued by the Korean Patent Office for Korean Patent Application No. 10-2013-0110378 dated Jun. 19, 2014.
Extended European Search Report for European Patent Application No. 13174192.8 dated Dec. 6, 2013.
English abstract of KR20080019800A, 1 page.
Second Office Action (Korean language) issued by the Korean Intellectual Property Office ("KIPO)") on Feb. 25, 2015 for International Application No. 10-2013-0110378, 5 pages.
English translation of second Office Action issued by KIPO on Feb. 25, 2015 for International Application No. 10-2013-0110378, 3 pages.
Third Office Action (Korean language) issued by the Korean Intellectual Property Office, in Korean patent application No. 10-2013-0110378, dated Aug. 28, 2015, Issuing No. 9-5-2015-058971631, 3 pages.
English translation of Third Office Action issued by the Korean Intellectual Property Office, in Korean patent application No. 10-2013-0110378, dated Aug. 28, 2015, Issuing No. 9-5-2015-058971631, 2 pages.
First Office Action (Chinese language) issued by the State Intellectual Property Office of People's Republic of China, in Chinese patent application No. 201210340180.9, dated Sep. 22, 2015, 6 pages.
English translation of First Office Action issued by the State Intellectual Property Office of People's Republic of China, in Chinese patent application No. 201210340180.9, dated Sep. 22, 2015, 5 pages.
English abstract of CN101086567A, dated Dec. 12, 2007, 1 page.
English abstract of CN1885140A, dated Dec. 27, 2006, 1 page.

* cited by examiner

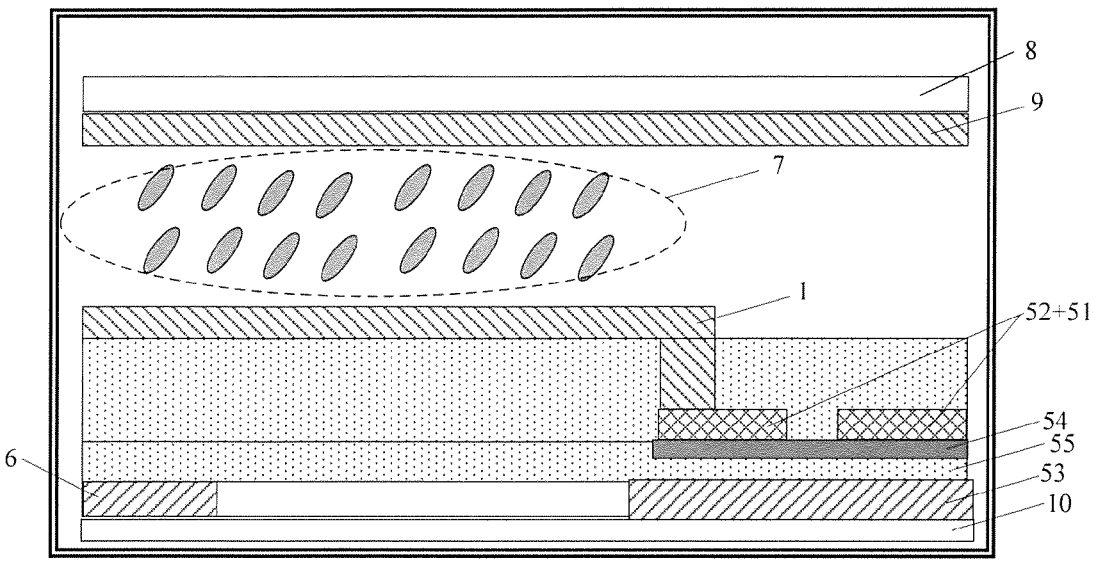
Figure 1 - Prior Art
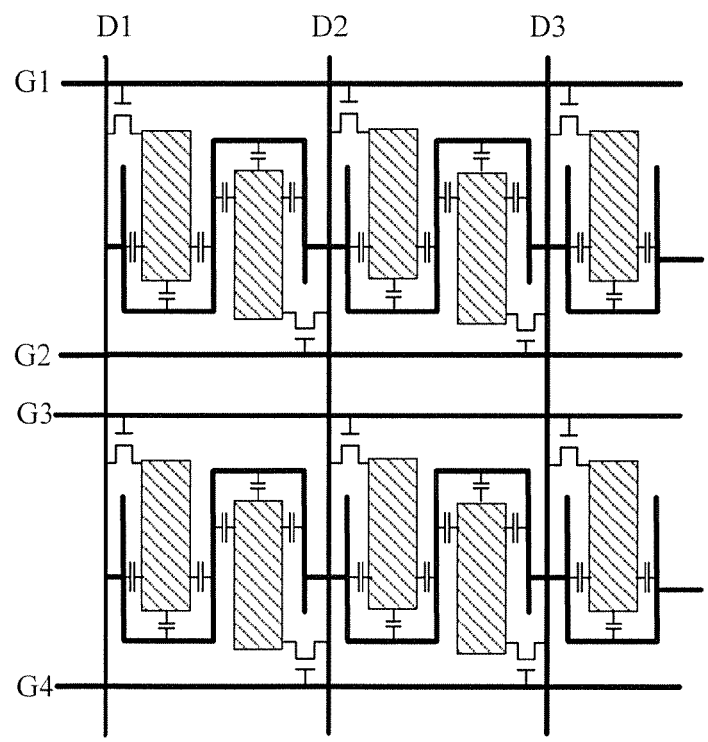
Figure 2 - Prior Art

ARRAY SUBSTRATE AND MANUFACTURING METHOD THEREOF AND DISPLAY DEVICE

CROSS REFERENCE TO RELATED APPLICATIONS

This application claims priority from Chinese National Application No. 201210340180.9, filed on Sep. 13, 2012, the contents of which are incorporated herein by reference.

FIELD OF THE INVENTION

Embodiments of the present invention relate to an array substrate, a manufacturing method thereof and a display device.

BACKGROUND

Thin-film transistor liquid crystal display (TFT-LCD) has advantages such as small size, low power consumption, being free of radiation, relatively low manufacturing costs, etc., and has dominated in the current flat panel display market.

As for a pixel array substrate with an existing structure, a pixel is defined by data signal lines and gate signal lines crossing with each other, in which a pixel electrode and a thin film transistor (TFT) as a switching element are included. A gate electrode of the TFT is connected to the gate signal line, a source electrode is connected to the data signal line, and a drain electrode is connected to the pixel electrode. A common electrode (Vcom) is formed so as to form a storage capacitor Cst with the pixel electrode.

FIG. 1 illustrates a schematic structure of an existing array substrate. As illustrated in FIG. 1, Vcom 6 is generally disposed on the gate layer and made from the same metal material as that of the gate electrode 53. FIG. 2 is a structure diagram of an existing double gate pixel array. As illustrated in FIG. 2, the array substrate includes a substrate on which pixel regions arranged in a matrix are formed, the pixel regions are formed with first pixel electrodes and first TFTs in an odd-number column and second pixel electrodes and second TFTs in an even-number column. The drain electrode of the first thin film transistor is connected to the first pixel electrode, and the drain electrode of the second thin film transistor is connected to the second pixel electrode. The array substrate is formed with first gate lines and second gate lines, the first gate lines are connected to the gate electrodes of the first thin film transistors, the second gate lines are connected to the gate electrodes of the second thin film transistors. The array substrate is formed with a data line, the data line is connected to the source electrode of the second thin film transistor in an even-number column and the source electrode of a first thin film transistor in a next pixel region in the same row and in the odd-number column. Alternatively, the data line is connected to the source electrode of the second thin film transistor in an even-number column and the source electrode of a first thin film transistor in a previous pixel region in the same row and in the odd-number column.

In summary, although the current array substrate adopts a double gate structure, the common electrode and the pixel electrode's overlapping area is too large, and the common electrode line is disposed transversely (i.e., parallel to the gate line), which is disadvantage to the wide-screen displaying.

SUMMARY

One of objects of embodiments of the present invention is to provide an array substrate, a manufacturing method thereof and a display device, which can reduce the overlapping area between the common electrode and the pixel electrode, thereby achieving the wide-screen displaying.

An embodiment of the invention provides an array substrate comprising a plurality of pixel regions arranged in a two-dimensional matrix, gate lines extending along a row direction of the two-dimensional matrix and data lines extending along a column direction of the two-dimensional matrix, each pixel region including a pixel electrode, wherein the array substrate further comprises at least one common electrode line, and the common electrode line is disposed to be parallel to the data lines.

In one example, each pixel region further comprises a thin film transistor as a switching element, the thin film transistor including a gate electrode, a source electrode and a drain electrode, the gate electrode is connected to a corresponding gate line, the source electrode is connected to a corresponding data line, and the drain electrode is connected to the pixel electrode; and the common electrode line is formed in the same layer as that of the data lines and the source/drain electrodes.

In one example, each pixel region further comprises a common electrode which is used to form a storage capacitor with the pixel electrode, and the common electrode line is connected to the common electrode.

In one example, the common electrode line is located between every two data lines, and one common electrode line is shared by pixel electrodes in an odd-number column and pixel electrodes in an even-number column.

In one example, the common electrode line is of an external wiring manner.

In one example, the common electrode line is of an internal wiring manner.

Another embodiment of the invention provides a method for manufacturing an array substrate, comprising:

forming a plurality of pixel regions arranged in a two-dimensional matrix, gate lines extending along a row direction of the two-dimensional matrix and data lines extending along a column direction of the two-dimensional matrix on a substrate, each pixel region including a pixel electrode; and forming at least one common electrode line on the substrate, and the common electrode line is disposed to be parallel to the data lines.

In one example, the common electrode line is formed in the same layer as that of the data lines.

In one example, the common electrode line is located between every two data lines, and one common electrode line is shared by pixel electrodes in a odd-number column and pixel electrodes in an even-number column.

In one example, the common electrode line is of an external wiring manner or an internal wiring manner.

Still another embodiment of the invention provides a display device, comprising the array substrate according to any embodiment of the invention.

As for the array substrate according to the embodiments of the invention, a double gate structure may be used, and a common electrode line which is disposed longitudinally and parallel to the data line is disposed in the pixel regions. The common electrode line is disposed between every two data lines.

With the embodiments of the invention, since the common electrode line is disposed longitudinally and parallel to the data lines, the overlapping area between the common electrode and the pixel electrode can be reduced, thereby achieving a wide-screen displaying.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a schematic structural diagram of an existing array substrate;

FIG. 2 is a diagram of a double gate structure diagram pixel array in an existing array substrate;

DETAILED DESCRIPTION

Figure 3:
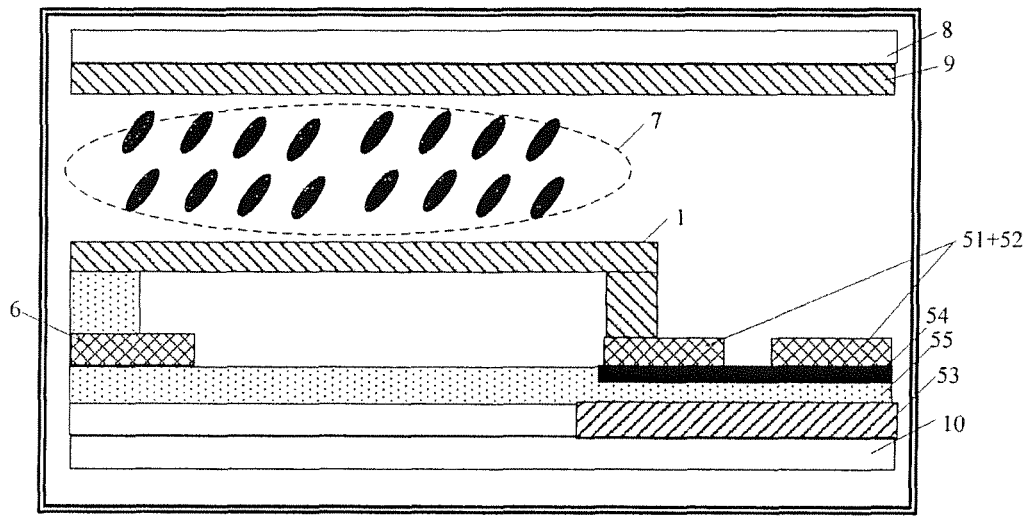
FIG. 3 is a schematic structural diagram of an array substrate according to an embodiment of the present invention.

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Currently, a double gate structure is increasingly widely used in the array substrate. Embodiments of the present invention are also based on the double gate array substrate structure. It comprises a substrate and pixel regions arranged in a matrix formed on the substrate. The pixel regions are formed with first pixel electrodes and first thin film transistors in an odd-number column and second pixel electrodes and second thin film transistors in an even-number column. The drain electrode of the first thin film transistor is connected to the first pixel electrode, and the drain electrode of the second thin film transistor is connected to the second pixel electrode. The array substrate is formed with first gate lines and second gate lines, the first gate lines are connected to the gate electrodes of the first thin film transistors, the second gate lines are connected to the gate electrodes of the second thin film transistors. The array substrate is formed with a data line, the data line is connected to the source electrode of the second thin film transistor in an even-number column and the source electrode of a first thin film transistor in a next pixel region in the same row and in the odd-number column. Alternatively, the data line is connected to the source electrode of the second thin film transistor in an even-number column and the source electrode of a first thin film transistor in a previous pixel region in the same row and in the odd-number column. The array substrate is formed with at least one common electrode line disposed longitudinally and parallel to the data lines.

Beneficial effects of the above solution are as follows: in the array substrate of the double-gate structure, each row of pixels are connected to two different gate signal lines, a data signal line can be connected to two columns of pixels, so that every four columns of pixels only require two data signal lines. For example, in a case that the pixel array of the array substrate has two rows and six columns of pixels, only four gate signal lines G1~G4 and three data signal lines D1, D2, D3 are required. With the embodiments of the present invention, since the common electrode line adopts a longitudinal layout, which is different from a transverse layout of common electrode line in the prior art, the overlapping area becomes smaller; further, since the area is reduced, wide-screen displaying can be achieved.

Here, the common electrode line and the data lines and the source/drain electrodes are formed in the same layer, which reduces the distance between the common electrode signal line and the pixel electrode.

FIG. 3 illustrates a structure of a display panel according to an embodiment of the present invention. The display panel may include an array substrate 10, a color filter substrate 8 and liquid crystal 7 interposed therebetween. The array substrate 10 includes a pixel electrode 1, a thin film transistor (TFT), and a common electrode 6. The color filter substrate 8 is provided with a transparent electrode 9 in its surface facing the array substrate 10. The TFT includes a gate electrode 53, an active layer 54, a gate insulating layer 55, a source electrode 51 and a drain electrode 52 (the source/drain electrodes are generally referred to as S/D). The pixel electrode 1 and the transparent electrode 9 is filled with liquid crystal 7 therebetween, the transparent electrode 9 is formed on a lower surface of the color filter substrate 8, and the TFT, the pixel electrode 1 and the common electrode 6 are formed on the array substrate 10. For example, the common electrode 6 and a common electrode signal line (not shown in FIG. 3) are formed in the same layer as that of the source/drain electrodes, i.e., the common electrodes 6 and the common electrode signal line are formed in the S/D layer. The common electrode 6 and the common electrode signal line may also be made of the same metal material as that of the S/D layer. Generally, the S/D layer may adopt conductive metal material such as Mo, AlNd, Al, Ti, Cu and the like; similarly, the common electrodes 6 and the common electrode signal line may also adopt the conductive metal materials such as Mo, AlNd, Al, Ti, Cu, and the like.

For example, the array substrate includes a plurality of pixel regions arranged in a two-dimensional matrix, gate lines extending along a row direction of the two-dimensional matrix and data lines extending along a column direction of the two-dimensional matrix. Each pixel region includes a pixel electrode. The array substrate further comprises at least one common electrode line, and the common electrode line is disposed to be parallel to the data lines. For example, the gate electrode 53 is connected to a corresponding gate line (G1, G2, . . . ), the source electrode 51 is connected to a corresponding data line (D1, D2, . . . ), and the drain electrode 52 is connected to the pixel electrode 1.

The direction in which the gate line extends (i.e., the row direction of the two-dimensional matrix as mentioned above) may be referred to the transverse direction, and the direction in which the data line extends (i.e., the column direction of the two-dimensional matrix as mentioned above) may be referred to the longitudinal direction. For example, the size of the array substrate along the transverse direction may be larger than that along the longitudinal direction. In one example, the array substrate is of a rectangle shape, the long side of the rectangle is along the transverse direction, the short side of the rectangle is along the longitudinal direction.

The beneficial effects of the above solution are as follows: a storage capacitor Cst is formed between the common electrode (Vcom) and the pixel electrode, and the Cst is calculated as: Cst=S/D; where, S represents an overlapping area between the pixel electrode and the Vcom; D represents the distance between the pixel electrode and the Vcom 6. Comparison between FIG. 1 and FIG. 3 can show that, since the common electrode line is formed in the same layer as that of the data lines and the source/drain electrodes in the embodiment of the present invention, which is different from the structure in which the common electrode line and the gate electrode are formed in the same layer in the prior art, the embodiments of the present invention reduces the distance between the pixel electrode and the Vcom, thereby avoiding a serial of disadvantage influence due to increasing the overlapping area between the pixel electrode and the Vcom for ensuring constant Cst in the case that the distance between the pixel electrode and the Vcom is relatively large in the prior art. Increasing area will result in reduced aperture ratio of the pixel electrode and increased resistance of the common electrode line; decrease in aperture ratio of the pixel electrode will increase the power consumption of the liquid crystal panel, and increase of the resistance of the common electrode line will increase the offset of the Vcom voltage, and Vcom offset will cause the liquid crystal panel color shift and generate the badness of greenish.

Here, the common electrode line is located between every two data lines, the first pixel electrodes in an odd column and the second pixel electrodes in an even-number column share one common electrode line.

It should be noted that, as long as the common electrode line is disposed longitudinally, the present embodiment of the invention is not limited to the structure in which the common electrode line is provided within every pixel region. It may be that several groups of pixel regions share one longitudinal common electrode line. In this case, the common electrodes in other pixel regions without longitudinal common electrode line length disposed therein are electrically connected to each other by means of transverse wires, and the longitudinal common electrode line is disposed in an external wiring manner.

Figure 4:
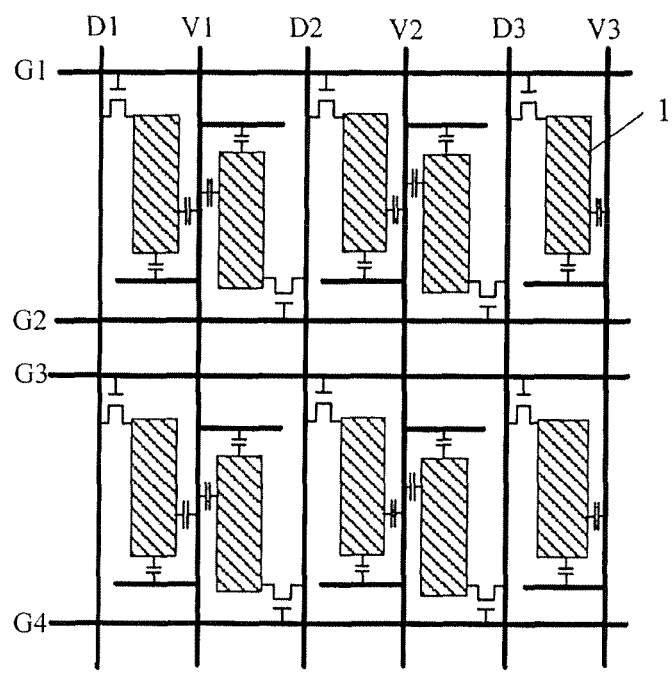
FIG. 4 is a schematic structural diagram of a pixel array of an array substrate according to an embodiment of the present invention.
Figure 5:
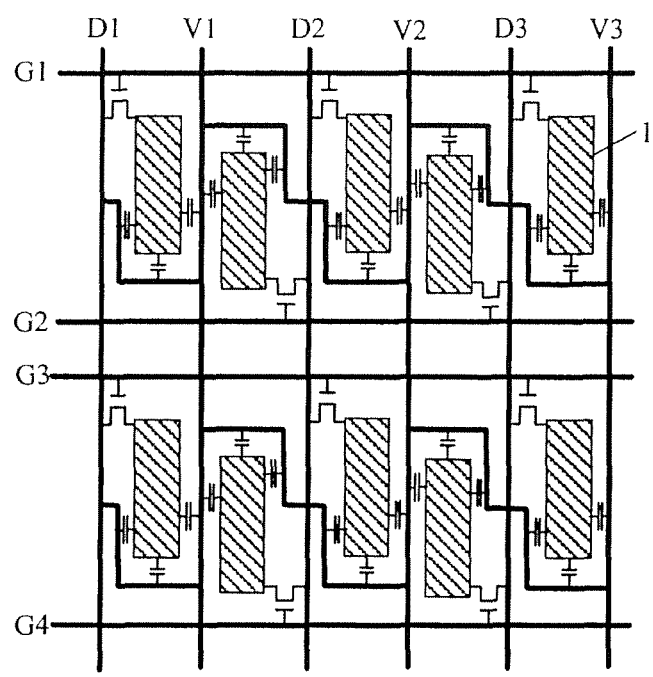
FIG. 5 is another schematic structural diagram of a pixel array of an array substrate according to an embodiment of the present invention.

Here, the common electrode line can be of an external wiring manner or an internal wiring manner. FIG. 4 illustrates the external wiring manner for the common electrode line of the pixel array; and FIG. 5 illustrates the external wiring manner for the common electrode line of the pixel array. The external wiring manner refers that the common electrode line electrically connects each common electrode in a region outside the display area (generally called fanout region), the internal wiring manner is specifically shown in FIG. 5, the common electrodes are electrically connected by disposing common electrode signal lines between each pixel row, that is, the difference common electrode lines are electrically connected within the pixel regions.

It should be noted that the double gate structure is not limited to the structure described above, it can also be of COA (color filter on array, a technology in which the color filter is integrated on the array substrate) configuration. Of course, the importance of the embodiment of the invention is in the wiring manner of the longitudinal common electrode line in the double gate structure, and the carrier is not particularly limited. Also, the present invention is also applicable to the dual data line structure. By disposing a longitudinal common electrode line in the dual data line structure, wide-screen displaying can be further realized. For example, the size of the array substrate in the transverse direction (i.e., the direction in which the gate line extends) is larger than that in the longitudinal direction (i.e., the direction in which the data line extends). In the embodiments of the invention, the common electrode line is disposed in the longitudinal direction (i.e., in parallel with the data line) instead of the transverse direction; therefore, the load of the common electrode line will be reduced remarkably, so that the array substrate according to the embodiments of the invention is very suitable for the wide-screen display.

An embodiment of the invention provides a manufacturing method for an array substrate, the substrate formed with first pixel electrodes in an odd-number column and second pixel electrodes in an even-numbered column, the method comprising: forming at least one common electrode line on the substrate, the common electrode line being disposed longitudinally and parallel to the data line.

For example, the method for manufacturing an array substrate comprises: forming a plurality of pixel regions arranged in a two-dimensional matrix, gate lines extending along a row direction of the two-dimensional matrix and data lines extending along a column direction of the two-dimensional matrix on a substrate, each pixel region including a pixel electrode; and forming at least one common electrode line on the substrate, and the common electrode line is disposed to be parallel to the data lines.

For example, the common electrode line is disposed in the same layer as that of the data lines and the source/drain electrodes.

For example, the common electrode line is disposed between every two data lines, the first pixel electrode disposed in the odd-number column and the second pixel electrode in the even-number column share one common electrode line.

For example, the common electrode line is of an external wiring manner or an internal wiring manner.

The implementation described above can be patterning process, for example, the step for disposing the common electrode line in the same layer as that of the data lines and the source/drain electrodes may be, depositing material on a substrate on which source/drain electrodes are to be formed, and then simultaneously forming the source/drain electrodes and the common electrode line by processes such as exposure, development, removing the photoresist, which will not be described in detail.

An embodiment of the invention provides a display device includes the above-mentioned array substrate.

As for the display device according to the embodiment of the present invention, it includes a longitudinal electrode line provided on the array substrate, and wide-screen displaying can be achieved. Further, the common electrode line and the source/drain electrodes layer are provided in the same layer, which further reduces the overlapping area between the pixel electrode and the common electrode.

The foregoing are merely exemplary embodiments of the invention, but are not used to limit the protection scope of the invention. The protection scope of the invention shall be defined by the attached claims.

What is claimed is:

1. An array substrate, comprising a plurality of pixel regions arranged in a two-dimensional matrix, gate lines extending along a row direction of the two-dimensional matrix and data lines extending along a column direction of the two-dimensional matrix, each pixel region including a pixel electrode, wherein the array substrate further comprises at least one common electrode line, and the common electrode line is disposed to be parallel to the data lines, wherein each common electrode line is disposed between two adjacent columns of pixel regions, wherein each common electrode line does not overlap with the pixel electrode, and wherein each pixel region further comprises a thin film transistor as a switching element, the thin film transistor including a gate electrode, a source electrode and a drain electrode, the gate electrode is connected to a corresponding gate line, the source electrode is connected to a corresponding data line, and the drain electrode is connected to the pixel electrode; and the common electrode line is formed in the same layer as that of the data lines and the source/drain electrodes.

2. The array substrate according to claim 1, wherein each pixel region further comprises a common electrode which is used to form a storage capacitor with the pixel electrode, and the common electrode line is connected to the common electrode.

3. The array substrate according to claim 1, wherein the common electrode line is located between every two data lines, and one common electrode line is shared by pixel electrodes in an odd-number column and pixel electrodes in an even-number column.

4. The array substrate according to claim 1, wherein the common electrode line is of an external wiring manner.

5. The array substrate according to claim 1, wherein the common electrode line is of an internal wiring manner.

6. A display device, comprising the array substrate according to claim 1.

7. The array substrate according to claim 1, wherein each pixel region further comprises a common electrode which is used to form a storage capacitor with the pixel electrode, and the common electrode line is connected to the common electrode.

8. The array substrate according to claim 1, wherein the common electrode line is located between every two data lines, and one common electrode line is shared by pixel electrodes in an odd-number column and pixel electrodes in an even-number column.

9. The array substrate according to claim 2, wherein the common electrode line is located between every two data lines, and one common electrode line is shared by pixel electrodes in an odd-number column and pixel electrodes in an even-number column.

10. The array substrate according to claim 7, wherein the common electrode line is located between every two data lines, and one common electrode line is shared by pixel electrodes in an odd-number column and pixel electrodes in an even-number column.

11. The array substrate according to claim 1, wherein, the common electrode line is provided in plural; in a direction parallel to the gate lines, the common electrode lines and the data lines are disposed alternately, and each column of pixel regions are defined by one common electrode line and one data line adjacent to each other.

12. The array substrate according to claim 2, wherein, in a same row of the two-dimensional matrix, the pixel electrode in an odd-number column and the pixel electrode in an even-number column are shifted along a first direction and a second direction which are opposite to each other and in the column direction, respectively, so that the pixel electrode in the odd-number column and the pixel electrode in the even-number column are offset with respect to each other, for the pixel electrode in the odd-number column, the common electrode is disposed at a side of the pixel electrode adjacent to the common electrode line and a side of the pixel electrode towards the second direction; for the pixel electrode in the even-number column, the common electrode is disposed at a side of the pixel electrode adjacent to the common electrode line and a side of the pixel electrode towards the first direction.

13. A method for manufacturing an array substrate, comprising: forming a plurality of pixel regions arranged in a two-dimensional matrix, gate lines extending along a row direction of the two-dimensional matrix and data lines extending along a column direction of the two-dimensional matrix on a substrate, each pixel region including a pixel electrode; and forming at least one common electrode line on the substrate, and the common electrode line is disposed to be parallel to the data lines, each common electrode line being disposed between two adjacent columns of pixel regions, wherein each common electrode line does not overlap with the pixel electrode, and wherein the common electrode line is formed in the same layer as that of the data lines.

14. The method according to claim 13, wherein the common electrode line is located between every two data lines, and one common electrode line is shared by pixel electrodes in an odd-number column and pixel electrodes in an even-number column.

15. The method according to claim 13, wherein the common electrode line is of an external wiring manner or an internal wiring manner.

* * * * *